United States Patent
Elbadry et al.

(10) Patent No.: US 10,547,297 B2
(45) Date of Patent: Jan. 28, 2020

(54) DIGITAL CLOCK DUTY CYCLE CORRECTION

(71) Applicant: TEXAS INSTRUMENTS INCORPORATED, Dallas, TX (US)

(72) Inventors: Mohammad Elbadry, San Diego, CA (US); Robert Floyd Payne, Lucas, TX (US); Gerd Schuppener, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/410,508

(22) Filed: May 13, 2019

(65) Prior Publication Data

US 2019/0267979 A1    Aug. 29, 2019

Related U.S. Application Data

(63) Continuation of application No. 16/023,643, filed on Jun. 29, 2018, now Pat. No. 10,291,218, which is a continuation of application No. 15/598,339, filed on May 18, 2017, now Pat. No. 10,033,365, which is a continuation of application No. 14/927,949, filed on Oct. 30, 2015, now Pat. No. 9,780,768.

(51) Int. Cl.
*H03K 3/017*    (2006.01)
*H03K 5/156*    (2006.01)
*H02M 3/07*    (2006.01)

(52) U.S. Cl.
CPC ............ *H03K 5/1565* (2013.01); *H02M 3/07* (2013.01)

(58) Field of Classification Search
CPC ........................................... H03K 3/017
USPC .................................. 327/172–175
See application file for complete search history.

(56) References Cited

U.S. PATENT DOCUMENTS

| | | | |
|---|---|---|---|
| 7,292,082 B2 * | 11/2007 | Nam ..................... | H03K 5/1565 327/172 |
| 10,291,218 B2 * | 5/2019 | Elbadry .................. | H02M 3/07 |
| 2004/0075462 A1 * | 4/2004 | Kizer .................... | H03K 5/1565 326/29 |

* cited by examiner

*Primary Examiner* — Tomi Skibinski
(74) *Attorney, Agent, or Firm* — Michael A. Davis, Jr.; Charles A. Brill; Frank D. Cimino

(57) ABSTRACT

A duty cycle correction circuit includes a charge pump and a controller. The charge pump includes a current source, a first output, and a second output. The charge pump routes current from the current source to the first output during a positive portion of a clock, and routes current from the current source to the second output during a negative portion of the clock. The controller compares charge accumulated from the first output to charge accumulated from the second output over a plurality of clock cycles to determine which of the positive portion of the clock and the negative portion of the clock is longer. The controller also generates a digital value that indicates an amount of adjustment to apply to a duty cycle of the clock based on which of the positive portion of the clock and the negative portion of the clock is longer.

11 Claims, 8 Drawing Sheets

DIGITAL CLOCK DUTY CYCLE CORRECTION

CROSS-REFERENCE TO RELATED APPLICATIONS

This application is a continuation of U.S. patent application Ser. No. 16/023,643 filed Jun. 29, 2018, which is a continuation of U.S. patent application Ser. No. 15/598,339 filed May 18, 2017 (issued as U.S. Pat. No. 10,033,365), which is a continuation of U.S. patent application Ser. No. 14/927,949 filed Oct. 30, 2015 (issued as U.S. Pat. No. 9,780,768), all of which are hereby fully incorporated herein by reference.

BACKGROUND

Clock signals are commonly used in many electronics circuits and for various purposes. For example, clock signals are used to trigger synchronous circuits (e.g., flip-flops) in digital circuits such as processors, memory devices, and so on. Clock signals may be generated with various types of oscillators and supporting circuitry. A clock signal continually transitions between two levels (e.g., logic high and logic low levels). The clock signal has a duty cycle that is determined by the time duration at logic high and the time duration at logic low.

The duty cycle of a clock signal is generally stated as a percentage. For example, a clock signal that has a pattern of 80% high and 20% low has an 80% duty cycle. In some applications, it may desirable that the duty cycle of a clock signal be a 50% cycle, where a 50% duty cycle has a waveform with equal high and low portions. For example, circuits that rely on both clock edges may not function properly if a 50% duty cycle clock is not applied to the circuits. Unfortunately, many types of circuits create duty cycle distortion, and it can be difficult to maintain a 50% duty cycle.

SUMMARY

In some embodiments, a clock generator includes a duty cycle correction circuit. The duty cycle correction circuit includes a charge pump and a controller. The charge pump includes a current source, a first output, and a second output. The charge pump is configured to route current from the current source to the first output during a positive portion of a clock, and to route current from the current source to the second output during a negative portion of the clock. The controller is configured to compare charge accumulated from the first output to charge accumulated from the second output over a plurality of clock cycles to determine which of the positive portion of the clock and the negative portion of the clock is longer. The controller is also configured to generate a digital value that indicates an amount of adjustment to apply to a duty cycle of the clock based on which of the positive portion of the clock and the negative portion of the clock is longer.

In other embodiments, a clock duty cycle correction circuit includes a charge pump and a controller. The charge pump includes a current source, a first current output terminal, a second current output terminal, a first clock input terminal, a second clock input terminal, a first transistor, a second transistor, a reset terminal, and a reset transistor. The first transistor is coupled to the current source, the first clock input terminal, and the first current output terminal to connect the current source to the first output terminal based on assertion of a clock signal at the first clock input terminal. The second transistor is coupled to the current source, the second clock input terminal, and the second current output terminal to connect the current source to the second output terminal based on assertion of an inverted version of the clock signal at the second clock input terminal. The reset transistor is coupled to the first current output terminal, the second current output terminal, and the reset terminal to short the first current output terminal to the second current output terminal based on assertion of a signal at the reset terminal. The controller is configured to compare charge accumulated from the first current output to charge accumulated from the second current output over a plurality of cycles of the clock signal to determine which of a positive portion of the clock signal and a negative portion of the clock signal is longer. The controller is also configured to generate a digital value that indicates an amount of adjustment to apply to a duty cycle of the clock signal based on which of the positive portion of the clock signal and the negative portion of the clock signal is longer.

In further embodiments, a method for correcting the duty cycle of a clock signal includes resetting charge storage elements to a same voltage prior to execution of an integration stage. During the integration stage, charge stored on a first of the charge storage elements is changed only during a high portion of each of a plurality of cycles of the clock signal, and charge stored on a second of the charge storage elements is changed only during a low portion of each of the plurality of cycles of the clock signal. After the integration stage, which of the high portion and low portion of the clock signal is longer is determined based on the charge stored on the charge storage elements, a digital value that controls the duty cycle of the clock signal is adjusted to reduce the length of the portion of the clock signal that is longer, and the digital value is applied to control the duty cycle of the clock signal.

DETAILED DESCRIPTION OF EXAMPLE EMBODIMENTS

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, then X may be based on Y and any number of other factors.

Conventional duty-cycle correction circuits are implemented as analog loops. While such implementations may be effective for correcting the duty cycle of continuous clock signals, burst mode applications present significant problems because the analog loop must settle every time a burst of clocks is generated. The requisite state of the loop for producing a 50% duty cycle is lost when the input clock is removed, requiring a long settling period every time the input clock is re-applied. Additionally, because continuous clock generation is required to maintain a 50% duty cycle, the power consumption of the duty cycle correction circuit and the system applying duty cycle correction are also increased.

Embodiments of the duty cycle correction circuit disclosed herein provide a reduced settling time for duty cycle correction in burst mode applications, and may also reduce overall cost by reducing the size of analog filter components such as capacitors or resistors needed for circuit implementation. In the duty cycle correction circuit of the present disclosure, the feedback path is implemented in the digital domain (instead of analog) with a digital-to-analog converter providing the analog signal required for offset correction. At system start-up, after an input clock is provided, the duty cycle correction circuit is allowed to settle to the desired accuracy. The value provided to the digital-to-analog converter at the end of settling is stored. If the clock is removed and then supplied again at a later time, the loop will start from the previously stored digital-to-analog converter input value allowing a faster settling time. Moreover, once the duty cycle correction circuit has settled, the bulk of the circuit, except for the digital-to-analog converter, can be turned off, reducing power consumption.

Figure 1:
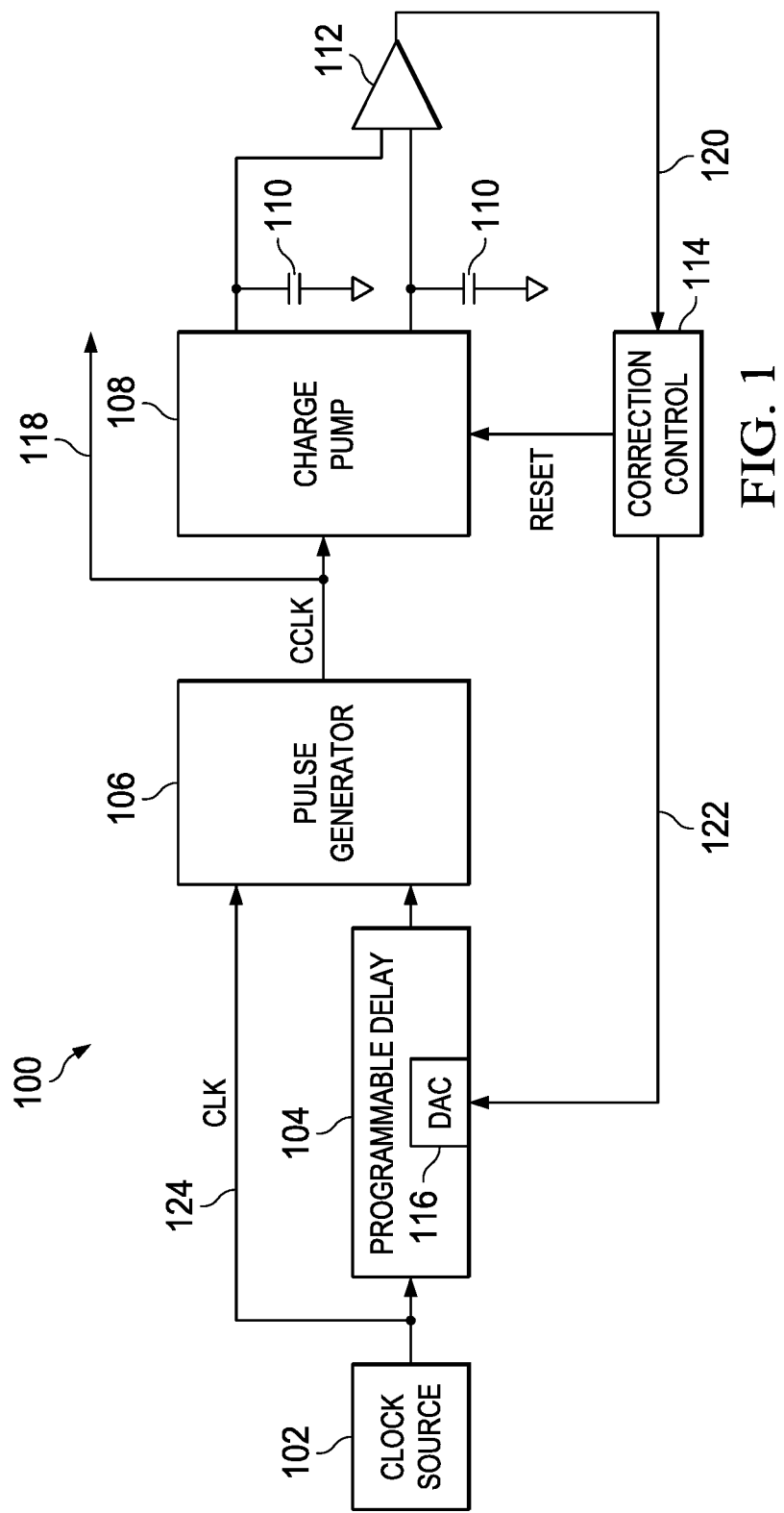
FIG. 1 shows a block diagram for a duty cycle correction circuit in accordance with various embodiments.

FIG. 1 shows a block diagram for a duty cycle correction (DCC) circuit 100 in accordance with various embodiments. The DCC circuit 100 includes a clock source 102, a programmable delay 104, a pulse generator 106, a charge pump 108, capacitors 110, comparator 112, and correction control logic 114. The clock source 102 may be an oscillator of any of various types. The duty cycle of the clock signal 124 provided by the clock source 102 may not be 50%. The clock source 102 provides clock signal 124 to the programmable delay 104 and the pulse generator 106. The programmable delay 104 delays the clock signal 124 by a time that varies and is controllable by a value received from the correction control logic 114. In some embodiments, the programmable delay 104 may include a digital-to-analog converter (DAC) 116 that converts a digital value 122 received from the correction control logic 114 to an analog signal (e.g., a voltage or current). The programmable delay 104 may vary the delay applied to the clock signal 124 as a function of the analog signal. For example, capacitance that affects propagation of the clock signal 124 through the programmable delay 102 may be varied as a function of the analog signal.

Some embodiments of the programmable delay 102 may vary delay applied to the clock signal 124 based on the digital value 122 received from the correction control logic 114 in a different manner. For example, the digital value 122 may be applied to generate a delay be selecting delay elements included in the programmable delay 102.

The pulse generator 106 generates a corrected clock signal 118 having the frequency of the clock signal 124 received from the clock source 102. The duty cycle of the corrected clock signal 118 is determined by the delayed clock signal received from the programmable delay 102. For example, a rising edge of the corrected clock signal 118 may be triggered by a rising edge of the clock signal 124 received from the clock source 102, and a falling edge of the corrected clock signal 118 may be triggered by a rising edge of the delayed clock signal received from the programmable delay 104. Thus, the duty cycle of the corrected clock signal 118 may be changed by changing the delay applied to the clock signal 124 by the programmable delay 104.

The charge pump 108, capacitors 110, and comparator 112 operate as a duty cycle detector to determine whether the duty cycle of the corrected clock signal 118 is greater than or less than 50%. The charge pump 108 includes two output terminals. A capacitor 110 is coupled to each of the output terminals. In some embodiments, a single capacitor 110 may be used with a different plate of the single capacitor 110 connected to each output terminal of the charge pump 108. The charge pump 108 also includes switching circuitry that routes current to each of the two output terminals based on the level of the corrected clock signal 118. That is, the charge pump 108 routes current to one of the two output terminals during a "high" portion of a cycle of the corrected clock signal 118, and routes current to the other of the two output terminals during a "low" portion of a cycle of the corrected clock signal 118. Thus, the currents provided by the charge pump 108 to charge the capacitor(s) 110 are proportional to the duty cycle of the corrected clock signal 118.

Figure 2:
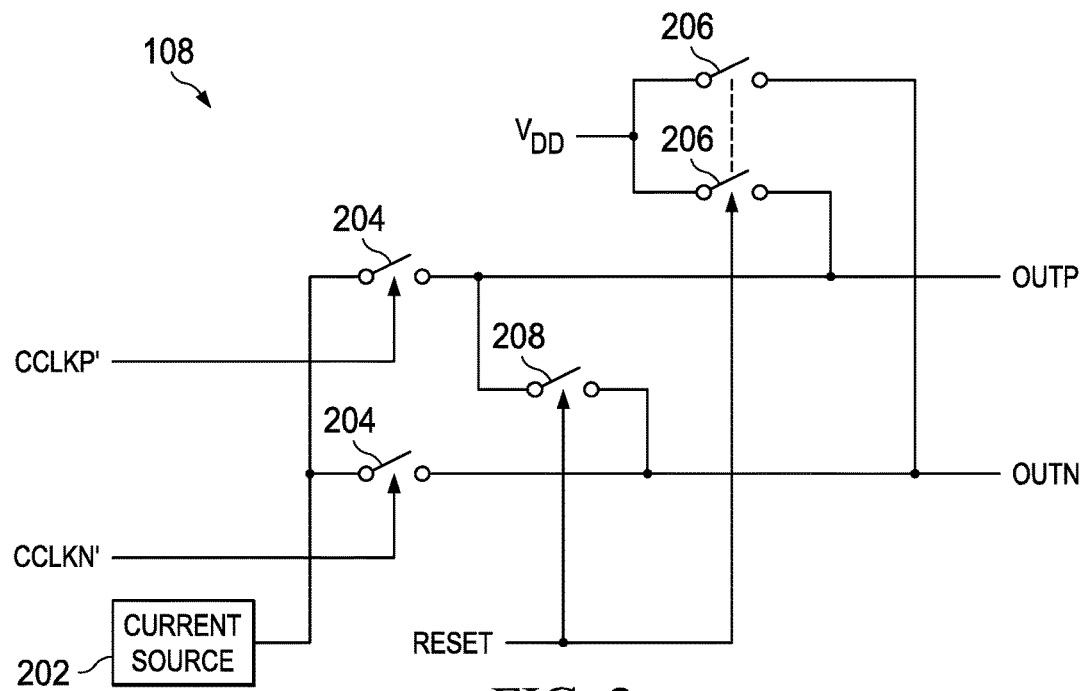
FIG. 2 shows a block diagram for a charge pump suitable for use in a duty cycle correction circuit in accordance with various embodiments.

FIG. 2 shows a block diagram for an embodiment of the charge pump 108. The charge pump 108 includes a current source 202 and switches 204, 206, and 208. The current source 202 may be a cascoded tail current source in some embodiments. Other embodiments may include a different type of constant current source as the current source 202. The switches 204 couple the current source 202 to the output terminals of the charge pump 108, and route current from the current source 202 to the output terminals based on the level of the corrected clock signal 118. When routing current to the output terminals of the charge pump 108 one of the switches 204 may be driven and controlled by an uninverted version of the corrected clock signal 118, and the other of the switches 204 may be driven and controlled by an inverted version of the corrected clock signal 118.

The charge pump 108 also includes a reset terminal. A reset signal asserted at the reset terminal controls the switches 206 and 208. Assertion of the reset signal causes the switches 206 and 208 to close and force the capacitor(s) 110 to an initial condition prior to charging/discharging the capacitor(s) 110 via the switches 204. The switches 204 may be opened while the reset signal is asserted. The switch 208 closes to short the output terminals of the charge pump 108. The switches 206 close to drive a predetermined reference voltage onto the output terminals. For example, closing the switches 206 may connect the output terminals of the charge pump 108 to a power supply voltage (e.g., $V_{DD}$). Thus, assertion of the reset signal may initialize the capacitor(s) 110 to a predetermined voltage prior to use of the switches 204 to route current to the capacitor(s) 110.

Figure 3:
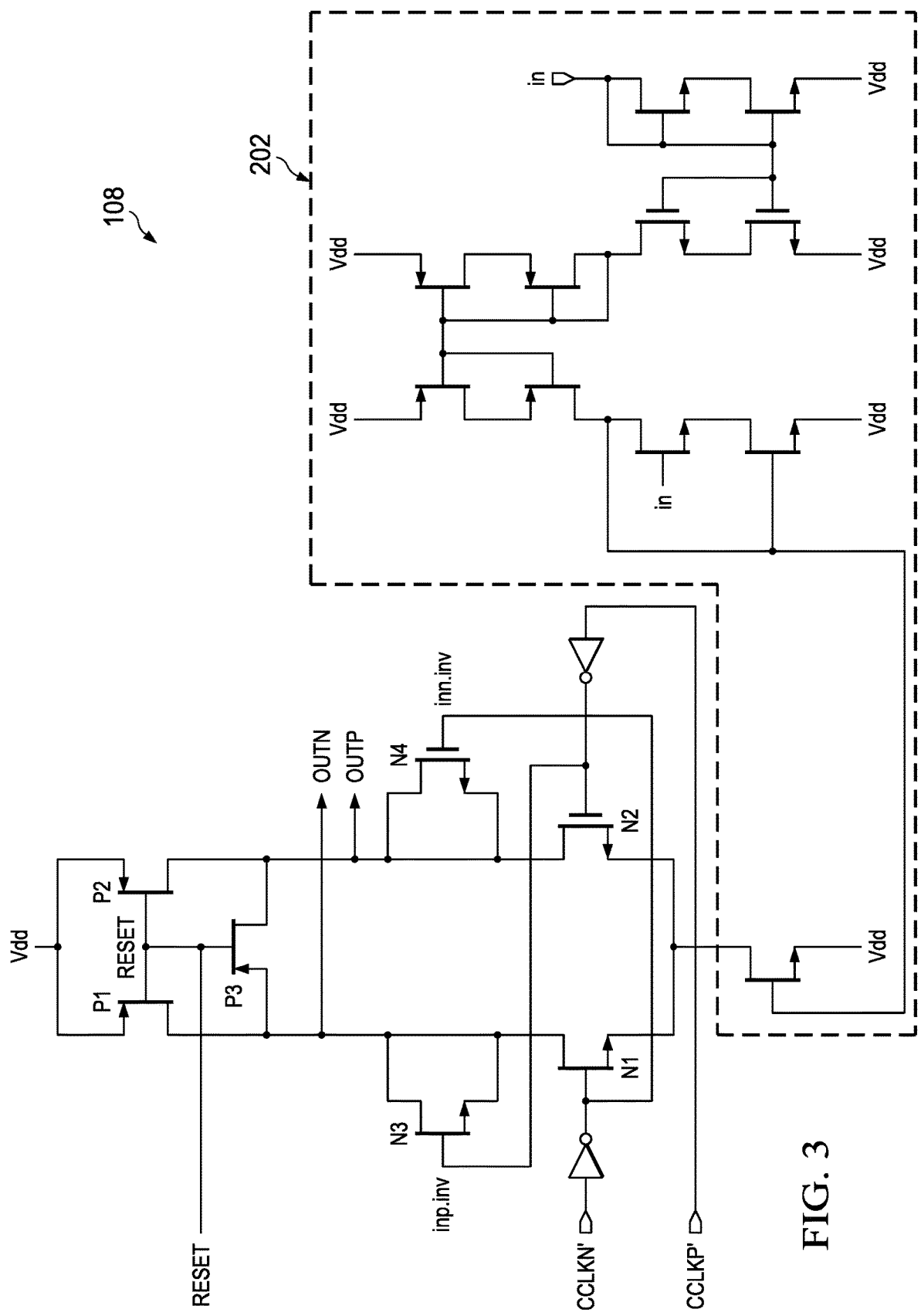
FIG. 3 shows a schematic diagram for a charge pump suitable for use in a duty cycle correction circuit in accordance with various embodiments.

FIG. 3 shows a schematic diagram for an embodiment of the charge pump 108. In the embodiment of FIG. 3, the switches 204 are implemented by N-channel field effect transistors (FETs) N1 and N2, the switches 206 are implemented by P-channel FETs P1 and P2, and the switch 208 is implemented by P-channel FET P3.

Figure 5:
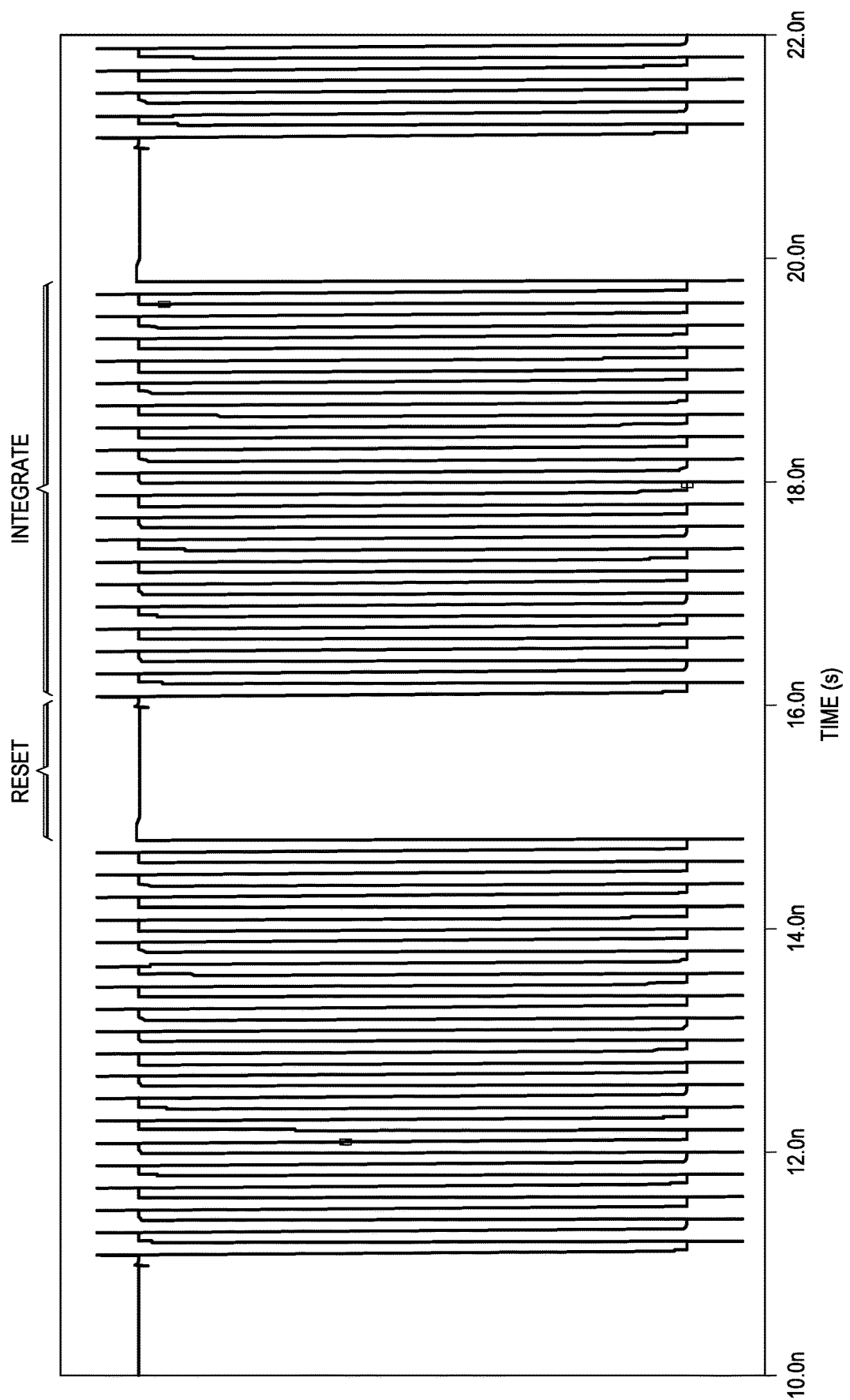
FIG. 5 shows a timing diagram for a clock signal provided to a charge pump in a duty cycle correction circuit in accordance with various embodiments.

After the capacitor(s) 110 have been initialized by assertion of the reset signal, the capacitor(s) 110 are charged or discharged via the switches 204 based on the duty cycle of the corrected clock signal 118. FIG. 5 shows a diagram of the corrected clock signal provided to the charge pump 108. During the "reset" interval, the corrected clock signal 118 applied to the charge pump 108 is forced to a predetermined level that opens the switches 204 while the switches 206 and 208 are closed to initialize the capacitor(s) 110. An "integration" interval follows the "reset" interval. During the "integration" interval a number of cycles of the corrected clock signal 118 are provided to the charge pump 108, and during each cycle of the corrected clock signal 118, the switches 204 route current from the current source 202 to the capacitor(s) 110 for determination of the duty cycle of the corrected clock signal.

Figure 4:
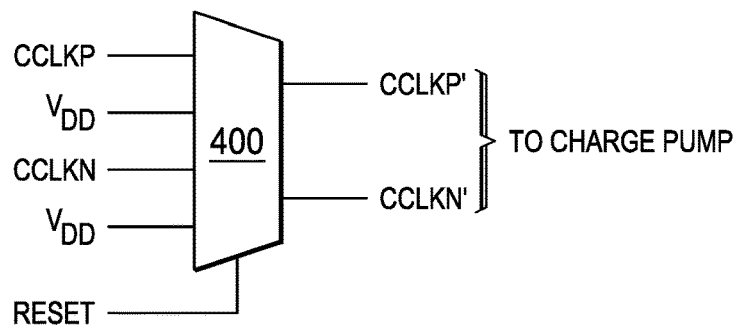
FIG. 4 shows a block diagram for a clock multiplexer that routes clock signals to a charge pump in a duty cycle correction circuit in accordance with various embodiments.

FIG. 4 shows a block diagram for a clock multiplexer 400 that may be applied between the pulse generator 106 and the charge pump 108 to force the corrected clock signal 118 received by the charge pump 108 to a predetermined level during the "reset" interval. For example, the outputs of the clock multiplexer 400 are high while the reset signal is asserted. While the reset signal is not asserted, the clock multiplexer 400 passes inverted and uninverted versions of the corrected clock signal 118 to the charge pump 108 for control of the switches 204.

Returning to FIG. 1, the comparator 112 identifies which level of the corrected clock signal 118 is longer by comparing the charge accumulated on the capacitor(s) 110 during the "low" level of the corrected clock signal 118 to the charge accumulated on the capacitor(s) 110 during the "high" level of the corrected clock signal 118. For example, if the charge accumulated on the capacitor(s) 110 during the "low" level of the corrected clock signal 118 is greater than the charge accumulated on the capacitor(s) 110 during the "high" level of the corrected clock signal 118, then the comparator 112 may output a first signal level. Otherwise, the comparator 112 may output a different signal level. In any case, the comparator 112 generates a signal 120 that indicates whether the "high" level or the "low" level of the corrected clock signal 118 is longer. The output signal 120 may be latched at completion of each "integration" interval for provision to the correction control logic 114.

The correction control logic 114 receives the comparator output signal 120, and adjusts the digital value 122 provided to the programmable delay 104 to change the duty cycle of the corrected clock signal 118 based on the comparator output signal 120. If the comparator output signal 120 indicates that the "high" portion of the corrected clock signal 118 is longer than the "low" portion of the corrected clock signal 118, then the correction control logic 114 may adjust the digital value 122 to change the delay applied in the programmable delay 104 such that the duration of the "high" portion of the corrected clock signal 118 is decreased and the duration of the "low" portion of the corrected clock signal 118 is increased. Similarly, if the comparator output signal 120 indicates that the "low" portion of the corrected clock signal 118 is longer than the "high" portion of the corrected clock signal 118, then the correction control logic 114 may adjust the digital value 122 to change the delay applied in the programmable delay 104 such that the duration of the "low" portion of the corrected clock signal 118 is decreased and the duration of the "high" portion of the corrected clock signal 118 is increased.

The correction control logic 114 may apply various adjustment methods to change the duty cycle of the corrected clock signal 118. For example, in one embodiment, the correction control logic 114 may increment or decrement the digital value 122 once per integration interval based on the comparator output signal 112 to move the corrected clock signal towards 50% duty cycle. In other embodiments, the correction control logic 114 may apply a successive approximation technique to more rapidly adjust the digital value 122 for achieve a 50% duty cycle.

Figure 6:
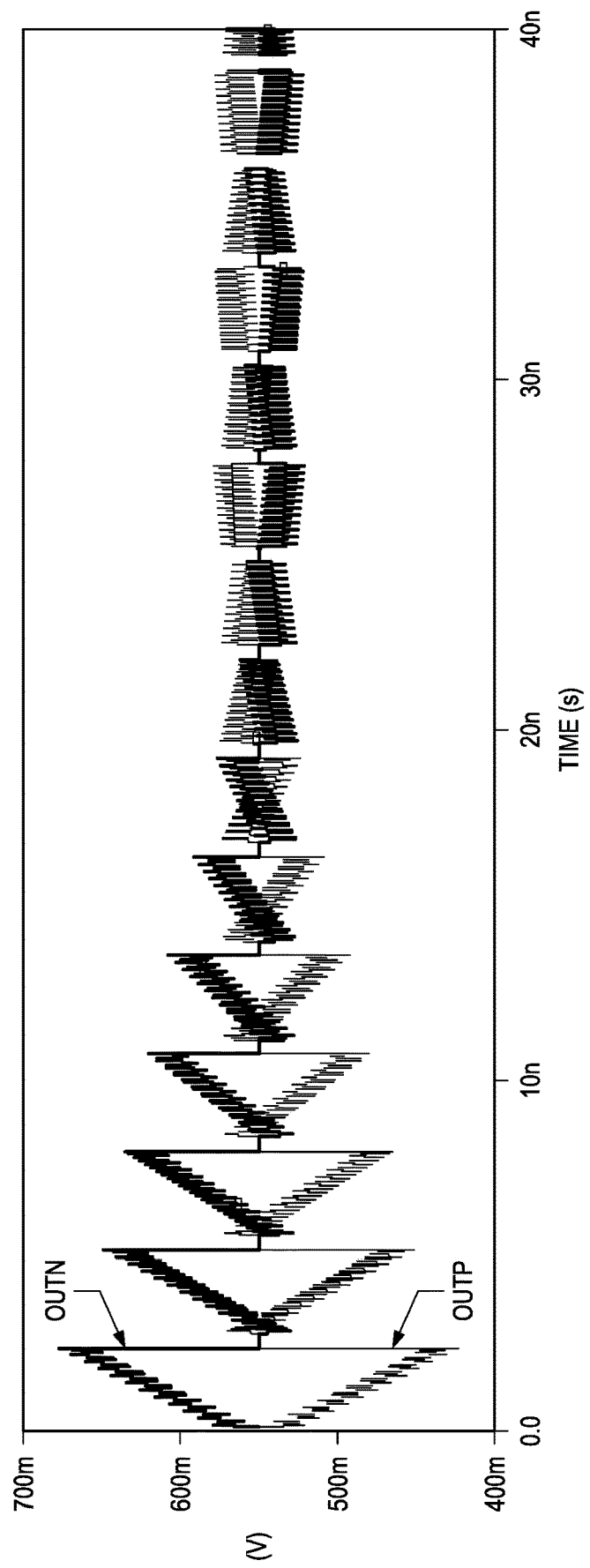
FIG. 6 shows outputs of a charge pump as a clock signal converges to a 50% duty cycle in a duty cycle correction circuit in accordance with various embodiments.

FIG. 6 shows the outputs of the charge pump 108 as the correction control logic 114 causes the corrected clock signal 118 to converge to a 50% duty cycle using a successive approximation technique to adjust the digital value 122. Initially, there is a large difference between the charge pump outputs. The difference is reduced as the duty cycle of the corrected clock signal 118 approaches 50%. Finally, once the loop has settled, the charge pump outputs change sign every integration interval as shown after about 20 ns. At the end of one interval, a given output is positive, and at the end of the successive integration interval, the given output is negative. Accordingly, the comparator output signal 120 flips between one and zero with each integration interval when the corrected clock signal 118 has converged to a 50% duty cycle.

The correction control logic 114 may also generate various control signals for the DCC circuit 100. For example, the correction control logic 114 may generate the reset signal, based on the corrected clock signal 118, to control timing of the reset and integration intervals in the charge pump 108, a latch control signal for latching the output of the comparator 112, and other control signals.

Figure 7:
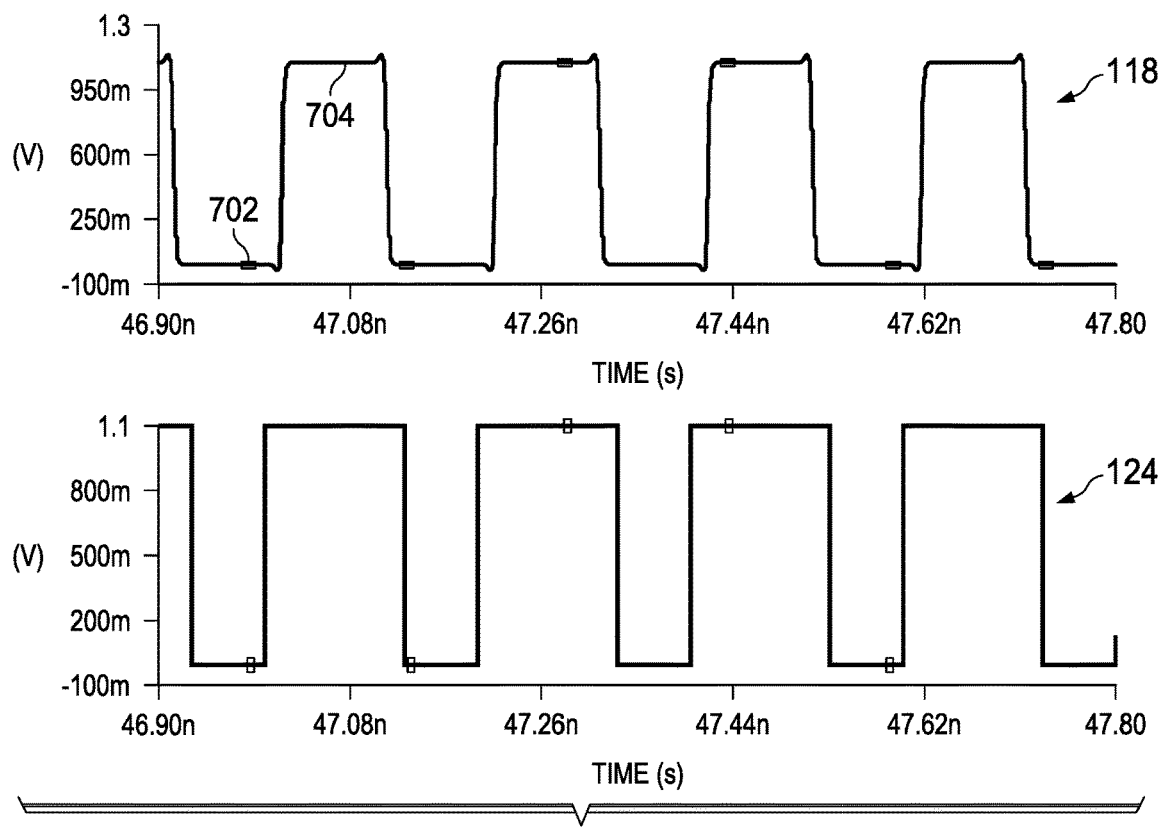
FIG. 7 shows an input clock signal and a duty cycle corrected clock signal produced by a duty cycle correction circuit in accordance with various embodiments.

FIG. 7 shows the clock signal 124 provided by the clock source 102 and the corrected clock signal 118. The clock signal 124 has about a 65% duty cycle. The duty cycle of the corrected clock signal 118 has been adjusted to 50% by the DCC circuit 100. That is, the DCC circuit 100 has adjusted the durations of the high (or positive) portion 704 and the low (or negative) portion 702 of the clock signal 118 such that the duration of the high (or positive) portion 704 of the clock signal 118 is approximately the same as the duration of the low (or negative) portion 702 of the clock signal 118.

For high accuracy clock correction, the DCC circuit 100 should detect the smallest possible clock cycle correctly. For example, if an accuracy of 1% is desired, the DCC circuit 100 has to be able to differentiate between a 49% duty cycle clock and a 51% duty cycle clock (i.e., the charge pump 108 has to generate a negative output for a 49% duty-cycle input and the comparator 112 has to be able to resolve that input as negative, and vice-versa for the 51%). With limited headroom in scaled CMOS technologies, the output of a nominal charge pump for the smallest outputs is small. With mismatch effects, the small output might change sign leading to a wrong decision. Accordingly, embodiments of the DCC circuit 100 may include offset calibration or offset cancellation.

Figure 8:
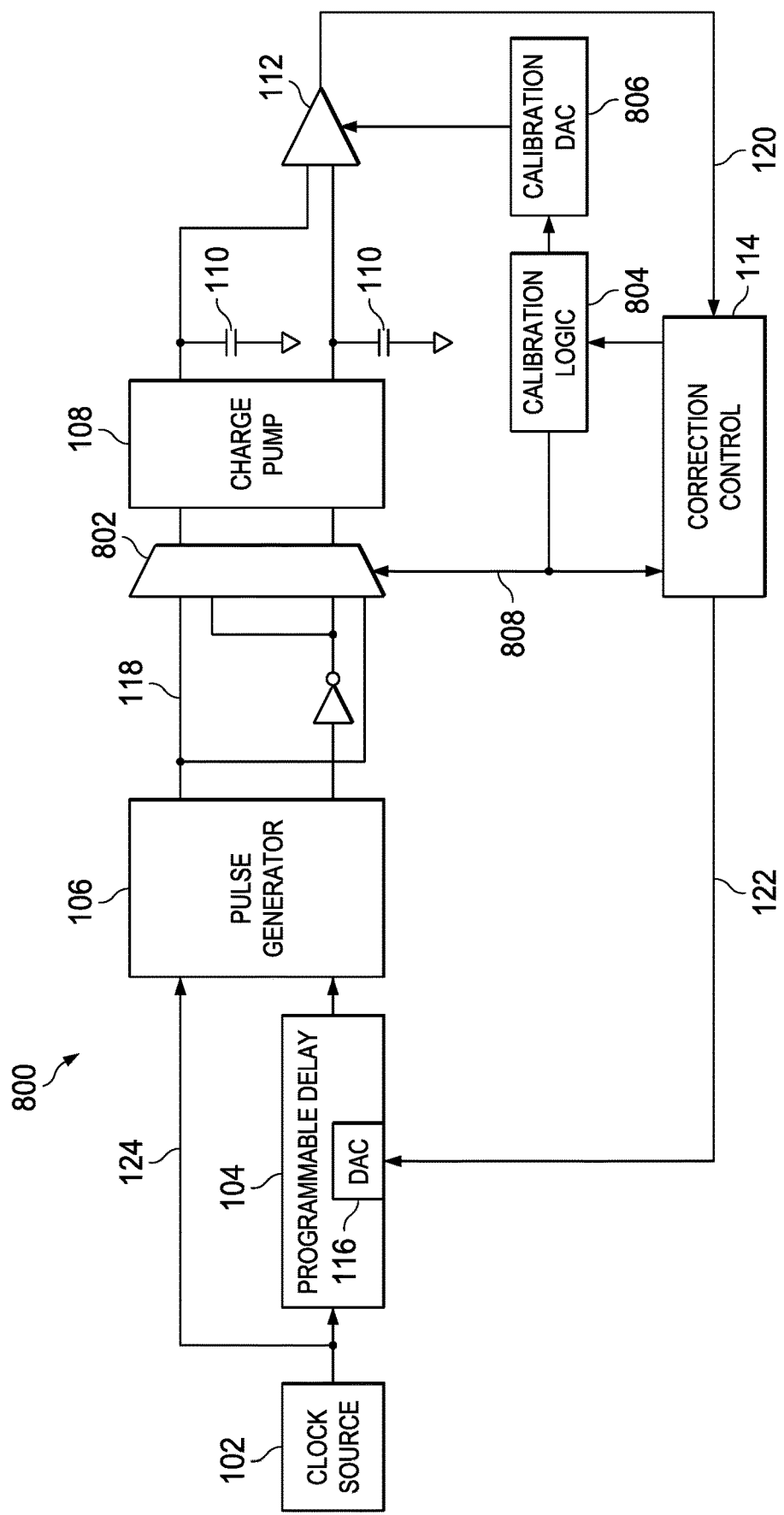
FIG. 8 shows a block diagram of a duty cycle correction circuit that includes in-loop calibration in accordance with various embodiments.

FIG. 8 shows a block diagram of a DCC circuit 800 that includes in-loop calibration in accordance with various embodiments. The DCC circuit 800 is similar to the DCC circuit 100, but includes additional calibration logic 804, a calibration DAC 806, and a calibration multiplexer 802. The correction control logic 114 may also include inversion circuitry to facilitate calibration. The calibration logic 804 generates a flip control signal 808 that controls the calibration multiplexer 802 and inversion circuitry in the correction control logic 114. Assertion of the flip control signal 808 causes the calibration multiplexer 802 to invert the corrected clock signal 118 provided to the charge pump 108 and to activate the inversion circuitry in the correction control logic 114 to invert the output of the comparator 112. The calibration logic 804 may adjust one or more components of the DCC circuit 800 to compensate for offset measured by the calibration. For example, the DAC 806 calibrates the DCC circuit 800 by changing the load to the comparator 112 as shown, or by changing the load to the charge pump 108. In some embodiments, the calibration logic 804 may compensate for measured offset by altering the values of the capacitors 110, creating an imbalance in the currents output by charge pump 108, apply an offset voltage at the input of the comparator 112, applying a current offset in the load of the comparator 112, selectable changing the size of a device in an input stage of the comparator 112, selectable changing the size of a device in an output stage of the charge pump 108, or making other offset compensation adjustments to the DCC circuit 800. Calibration using the DCC circuit 800 is advantageous in that calibration does not require a 50% duty cycle clock, however the duty cycle of the corrected clock signal 118 changes during the calibration process. Therefore this technique is only appropriate during an initial calibration period or during a period in normal operation where a duty cycle deviation from 50% is acceptable.

Assume the offset of the charge pump 108 and comparator 112 combination causes the output duty cycle of the corrected clock signal 118 to be 50%+Δx %. With the flip signal 808 not asserted, this means that the signal directly at the input to the charge pump 108 will have a duty-cycle of 50%+Δx %. Assume the corresponding digital value 122 at the input of the DAC 116 to be DAC_noflip. Now, let the flip signal 808 be asserted to invert the clocks 118 input to the charge pump 108 and activate inversion of the comparator output 102 in the correction control logic 114. Again, due to the offset of the charge pump 108 and comparator 112, the loop settles when the input to the charge pump is at a duty-cycle of 50%+Δx %. This, in turn, means that the duty cycle of the corrected clock signal 118 is (100%−(50%+Δx %.)) i.e. 50%−Δx %. Let the corresponding digital value 122 applied to the DAC 116 be DAC_flip. Given this information, two approaches are possible for offset correction.

In a first approach, the calibration DAC 806 is used to counteract the offset of the charge pump 108 and comparator 112. In this case, the above procedure is repeated for each code of the calibration DAC 806 until DAC_flip=DAC_noflip. This requires $2^N$ calibration cycles for a calibration DAC 806 of N-bits. In some embodiments, a binary-search (successive approximation) approach is used to achieve the same target in N calibration cycles.

In a second approach, the DCC correction loop is opened, disconnecting the charge pump 108, the comparator 112, and the correction control logic 114, and a digital value 122 equal to the average of DAC_noflip+DAC_flip is applied to the DAC 116. This approach requires that the DAC 116 be linear within a desired accuracy.

Figure 9:
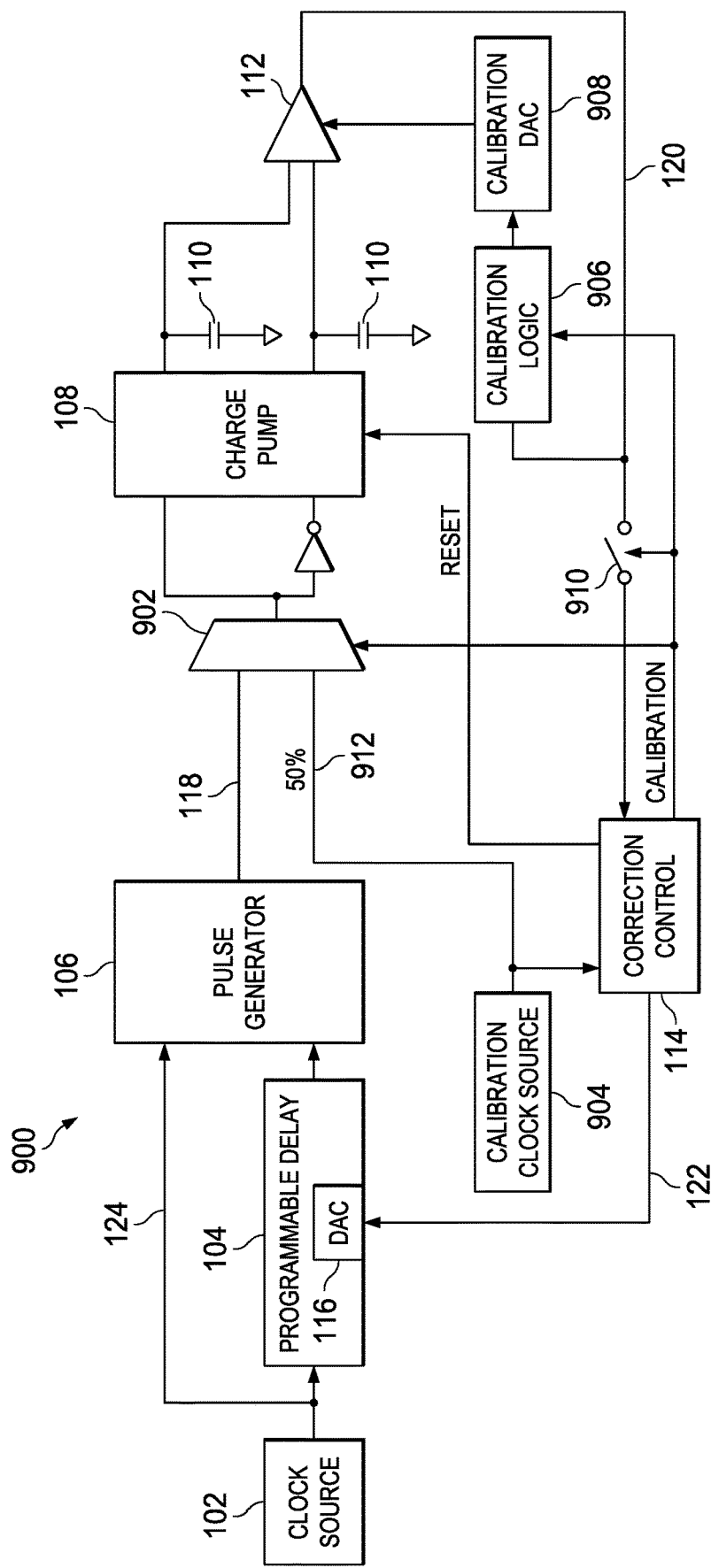
FIG. 9 shows a block diagram of a duty cycle correction circuit that includes off-loop calibration in accordance with various embodiments.

FIG. 9 shows a block diagram of a DCC circuit 900 that includes off-loop calibration in accordance with various embodiments. The DCC circuit 900 allows the duty cycle of the corrected clock 118 to remain constant while calibration to be performed. As a result, the DCC circuit 900 can be periodically calibrated without disrupting normal clock generation. The DCC circuit 900 is similar to the DCC circuit 100, but includes additional calibration logic 906, a calibration DAC 908, a calibration multiplexer 902, and a calibration clock source 904. The calibration clock source 904 provides a calibration clock 912 having a 50% duty cycle for use in calibrating the DCC circuit 900. The calibration clock source 904 may generate the calibration clock 912 by dividing the clock signal 124 by two or by any other method of generating a 50% duty cycle clock signal. The calibration multiplexer 902 selectively routes the calibration clock 912 or the corrected clock signal 118 to the charge pump 108.

During calibration, the correction control logic 114 generates the reset signal based on the calibration clock 912. If the calibration clock 912 is generated by dividing the clock signal 124 by two, then the number of clock cycles applied to the reset interval and the integration interval may also be divided by two to maintain the same integration time as used with the corrected clock signal 118. The switch 910 may be opened to isolate the correction logic 114, the programmable delay 104, and the pulse generator 106 from the circuitry being calibrated. The state of the correction logic 114, the programmable delay 104, and the pulse generator 106 may be unaffected by the calibration process. That is, the digital value 122 provided to the programmable delay 122 may be constant during calibration, thereby maintaining the duty cycle of the corrected clock signal 118 during calibration. The calibration logic 906 changes (e.g., changes incrementally) the value applied to the calibration DAC 908 until the output of the comparator changes (e.g., changes from high to low, or from low to high). The value applied to the calibration DAC 908 to cause the change in comparator output is the calibration value.

Some embodiments of the calibration logic 906 may apply a successive approximation technique to identify the calibration value. For example, assuming that a minimum value applied to the calibration DAC 908 causes a negative offset and negative comparator output, and vice-versa, a successive approximation search for the calibration value may proceed as follows:

1) The most significant bit (MSB) of the value applied to the calibration DAC 908 is set to 1 and all other of the bits of the value are set to zero.
2) The output of the comparator 112 is checked. If the output is positive, then the MSB of the value applied to the calibration DAC 908 is set to 0 and the value of the next most significant bit is set to 1. If the output is negative, then the value of the MSB is set to 1 and the value of the next most significant bit is also set to 1.
3) Calibration proceeds in this fashion until all bits are set. The resulting code is the desired DAC calibration code.

Figure 10:
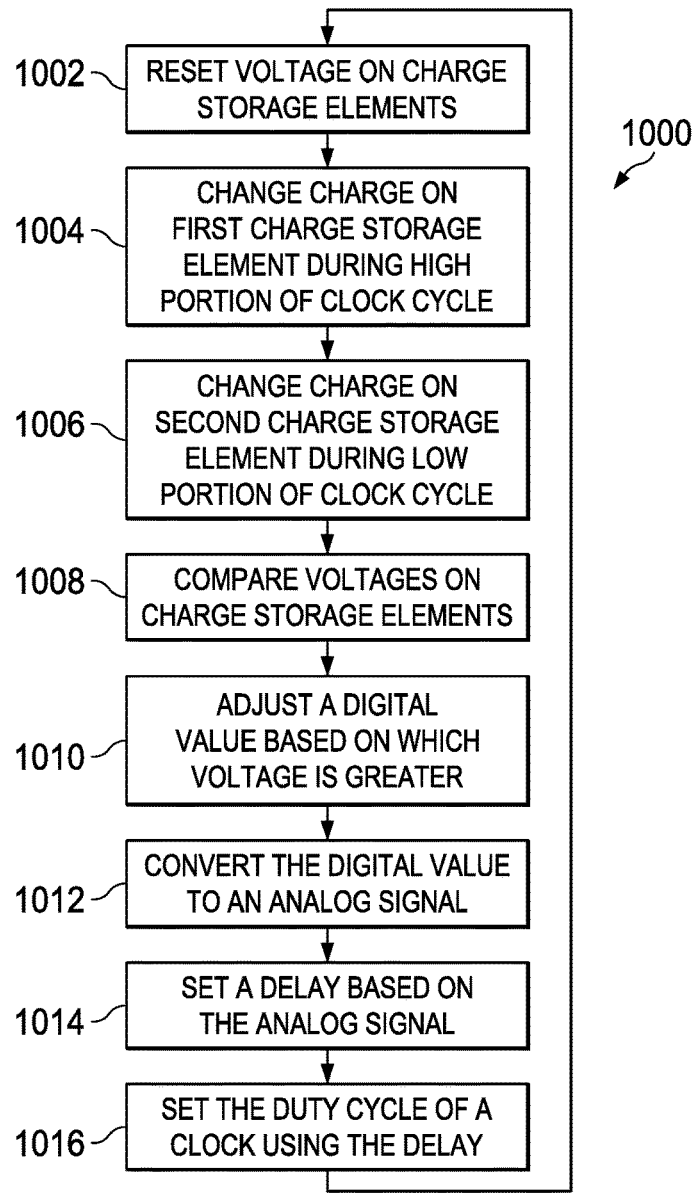
FIG. 10 shows a flow diagram for a method for duty cycle correction in accordance with various embodiments.

FIG. 10 shows a flow diagram for a method 1000 for duty cycle correction in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 600, as well as other operations described herein, can be implemented in the DCC circuit 100.

In block 1002, the voltages on charge storage elements (capacitors 110) used to measure duty cycle are reset to a common predetermined voltage. In the DCC circuit 100, the resetting is implemented by closing switches 206 and 208 in the charge pump 108 responsive to assertion of a reset signal received by the charge pump 108.

In block 1004, the capacitors 110 have reset during a reset interval in preparation for accumulation of charge on the capacitors during an integration interval. During the integration interval, multiple cycles of a clock are received by the charge pump 108. During a high portion of each clock cycle received by the charge pump 108, the charge pump 108 routes current from a constant current source 202 to a first of the capacitors 110 to change the charge stored on the capacitor in proportion to the duration of the high portion of the clock signal.

In block 1006, during a low portion of each clock cycle received by the charge pump 108, the charge pump 108 routes current from the constant current source 202 to a second of the capacitors 110 to change the charge stored on the capacitor in proportion to the duration of the low portion of the clock signal.

In block 1008, the voltages on the capacitors 110 are compared (e.g., by the comparator 112).

In block 1010, a digital value is adjusted based on which of the voltages is greater. For example, if the voltage stored on the first of the capacitors 110 is greater than the voltage stored on the second of the capacitors 110, then the digital value may be increased. Similarly, if the voltage stored on the first of the capacitors 110 is less than the voltage stored on the second of the capacitors 110, then the digital value may be decreased. In the DCC circuit 100, the correction control logic 114 may adjust the digital value based on the output of the comparator 112.

In block 1012, the digital value is converted to an analog signal (e.g., converted to a voltage in the DAC 116). In some embodiments, the digital value may be directly applied to select an amount of delay, rather than converted to an analog signal.

In block 1014, the analog signal is applied to set a time delay, and the time delay is applied to delay a clock signal. In the DCC circuit 100, the programmable delay 104 applies the analog signal to delay the clock signal 124. In embodiments, that apply the digital value directly, the programmable delay 104 applies a delay selected based on the digital value to delay the clock signal 124.

In block 1016, the delayed clock signal is used to set the duty cycle of an output clock signal (e.g., the corrected clock signal 118).

These operations may be repeated any number of times to reduce the time difference between the high portion and low portion of the output clock signal. In addition to the operations discussed above, calibration operations as disclosed herein may be performed to reduce the effects of offset in the DCC circuit 100 on output clock duty cycle.

Modifications are possible in the described embodiments, and other embodiments are possible, within the scope of the claims.

What is claimed is:

1. A clock generator, comprising:
    clock circuitry having a digital input and a clock output, the clock circuitry configured to: provide a clock signal at the clock output, the clock signal having a positive portion, a negative portion and a duty cycle; and adjust the duty cycle responsive to a digital value at the digital input; and
    a duty cycle correction circuit including:
        a charge pump having a clock input and first and second charge pump outputs, the clock input coupled to the clock output, the charge pump including a current source configured to provide a current, and the charge pump configured to: route the current to the first charge pump output during the positive portion, in which the first charge pump output accumulates a first charge over clock cycles of the clock signal; and route the current to the second charge pump output during the negative portion, in which the second charge pump output accumulates a second charge over the clock cycles;
        a comparator having a comparator output and first and second comparator inputs, the first comparator input coupled to the first charge pump output, the second comparator input coupled to the second charge pump output, and the comparator configured to: compare the first and second charges to determine which of the positive portion or the negative portion is longer; and provide a comparison signal at the comparator output responsive to the comparing; and
        a controller having a controller input and a controller output, the controller input coupled to the comparator output, the controller output coupled to the digital input, and the controller configured to provide the digital value at the controller output responsive to the comparison signal.

2. The clock generator of claim 1, wherein the clock circuitry is configured to adjust the duty cycle responsive to the digital value, in which: responsive to the comparison signal indicating the positive portion is longer, a length of the positive portion is reduced; and responsive to the comparison signal indicating the negative portion is longer, a length of the negative portion is reduced.

3. The clock generator of claim 1, further comprising: a first capacitor coupled to the first charge pump output, the first capacitor configured to accumulate the first charge; and a second capacitor coupled to the second charge pump output, the second capacitor configured to accumulate the second charge.

4. The clock generator of claim 1, wherein the clock circuitry includes:
    a digital-to-analog converter coupled to the digital input, the digital-to-analog converter having an analog output; and
    a pulse width adjuster coupled to the analog output, the pulse width adjuster configured to adjust the duty cycle responsive to an analog signal at the analog output.

5. The clock generator of claim 1, wherein the charge pump is configured to reset the first and second charges, including by setting the first charge pump output and the second charge pump output to a same voltage before one of the clock cycles.

6. The clock generator of claim 1, further comprising calibration circuitry including:
    a calibration clock source having a calibration clock output, the calibration clock source configured to provide a calibration clock signal at the calibration clock output, the calibration clock signal having a 50% duty cycle; and
    a multiplexer coupled between the clock output and the clock input, and coupled between the calibration clock output and the clock input, the multiplexer having a selection input, and the multiplexer configured to: provide the clock signal, instead of the calibration clock signal, to the clock input responsive to a first signal at the selection input; and provide the calibration clock signal, instead of the clock signal, to the clock input responsive to a second signal at the selection input;
    in which the controller has a selection output coupled to the selection input, and the controller is configured to: selectively provide the first and second signals at the selection output; and while providing the first signal at the selection output, adjust the digital value at the controller output responsive to the comparison signal;

and while providing the second signal at the selection output, keep the digital value constant at the controller output, and incrementally adjust one or both of the charge pump or the comparator to determine an adjustment at which the comparison signal changes.

7. A clock generator comprising:

clock circuitry having a digital input and a clock output, the clock circuitry configured to: provide a clock signal at the clock output, the clock signal having a positive portion, a negative portion and a duty cycle; and adjust the duty cycle responsive to a digital value at the digital input; and a charge pump having a reset input, a clock input and first and second charge pump outputs, the clock input coupled to the clock output, the charge pump including a current source, and the charge pump configured to: connect the current source to the first charge pump output during the positive portion, in which the first charge pump output accumulates a first charge over clock cycles of the clock signal; connect the current source to the second charge pump output during the negative portion, in which the second charge pump output accumulates a second charge over the clock cycles; and short the first charge pump output to the second charge pump output responsive to a reset signal at the reset input;

a comparator having a comparator output and first and second comparator inputs, the first comparator input coupled to the first charge pump output, the second comparator input coupled to the second charge pump output, and the comparator configured to: compare the first and second charges to determine which of the positive portion or the negative portion is longer; and provide a comparison signal at the comparator output responsive to the comparing; and a controller having a controller input and a controller output, the controller input coupled to the comparator output, the controller output coupled to the digital input, and the controller configured to provide the digital value at the controller output responsive to the comparison signal.

8. The clock generator of claim 7, further comprising: a first capacitor coupled to the first charge pump output, the first capacitor configured to accumulate the first charge; and a second capacitor coupled to the second charge pump output, the second capacitor configured to accumulate the second charge.

9. The clock generator of claim 7, wherein the clock circuitry includes:
   a digital-to-analog converter coupled to the digital input, the digital-to-analog converter having an analog output; and
   a pulse width adjuster coupled to the analog output, the pulse width adjuster configured to adjust the duty cycle responsive to an analog signal at the analog output.

10. The clock generator of claim 7, wherein the controller has a reset output coupled to the reset input, and the controller is configured to zero the first and second charges, including by providing the reset signal at the reset output before one of the clock cycles.

11. The clock generator of claim 7, further comprising calibration circuitry including:
   a calibration clock source having a calibration clock output, the calibration clock source configured to provide a calibration clock signal at the calibration clock output, the calibration clock signal having a 50% duty cycle; and
   a multiplexer coupled between the clock output and the clock input, and coupled between the calibration clock output and the clock input, the multiplexer having a selection input, and the multiplexer configured to: provide the clock signal, instead of the calibration clock signal, to the clock input responsive to a first signal at the selection input; and provide the calibration clock signal, instead of the clock signal, to the clock input responsive to a second signal at the selection input;
   in which the controller has a selection output coupled to the selection input, and the controller is configured to: selectively provide the first and second signals at the selection output; and while providing the first signal at the selection output, adjust the digital value at the controller output responsive to the comparison signal; and while providing the second signal at the selection output, keep the digital value constant at the controller output, and incrementally adjust one or both of the charge pump or the comparator to determine an adjustment at which the comparison signal changes.

* * * * *